United States Patent
Kliewer et al.

(10) Patent No.: US 6,781,889 B2
(45) Date of Patent: Aug. 24, 2004

(54) METHOD FOR OPERATING A SEMICONDUCTOR MEMORY AND SEMICONDUCTOR MEMORY

(75) Inventors: Jörg Kliewer, München (DE); Rupert Lukas, Lörrach-Hauingen (DE); Manfred Pröll, Dorfen (DE); Stephan Schröder, München (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 10/247,572

(22) Filed: Sep. 19, 2002

(65) Prior Publication Data

US 2003/0053354 A1 Mar. 20, 2003

(30) Foreign Application Priority Data

Sep. 19, 2001 (DE) .......................................... 101 46 185

(51) Int. Cl.$^7$ .............................................. G11C 16/04
(52) U.S. Cl. .............. 365/189.09; 365/203; 365/230.06
(58) Field of Search ................................ 365/189, 203, 365/230.06, 227, 204, 202

(56) References Cited

U.S. PATENT DOCUMENTS

| | | | |
|---|---|---|---|
| 5,121,356 A | 6/1992 | Park et al. | |
| 5,615,164 A | 3/1997 | Kirihata et al. | |
| 5,742,185 A | 4/1998 | Lee | |
| 6,333,874 B2 * | 12/2001 | Yamauchi | 365/189.09 |
| 6,584,032 B2 * | 6/2003 | Fujioka et al. | 365/227 |

* cited by examiner

*Primary Examiner*—David Lam
(74) *Attorney, Agent, or Firm*—Laurence A. Greenberg; Werner H. Stemer; Gregory L. Mayback

(57) ABSTRACT

An additional test mode is introduced in a semiconductor memory. A multiplicity of word lines are simultaneously activated by a word line decoder in the test mode. After a potential equalization of complementary bit lines, a logic "0" or a logic "1" is applied to an equalization circuit via a voltage generator. It is thus possible for the entire memory cell array to be preallocated an identical data value or, in strip form, alternating data values. Test time is thereby saved.

16 Claims, 2 Drawing Sheets

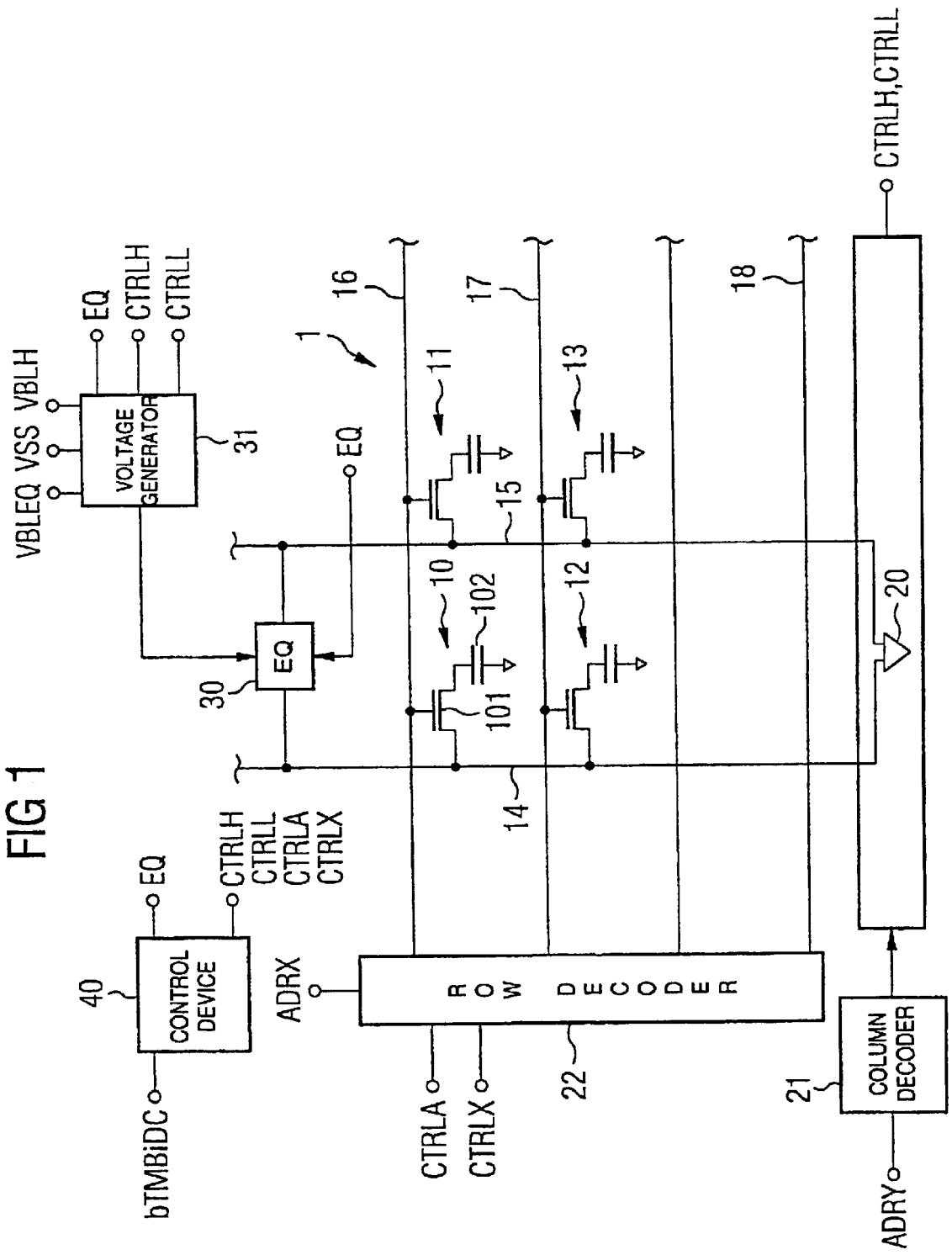

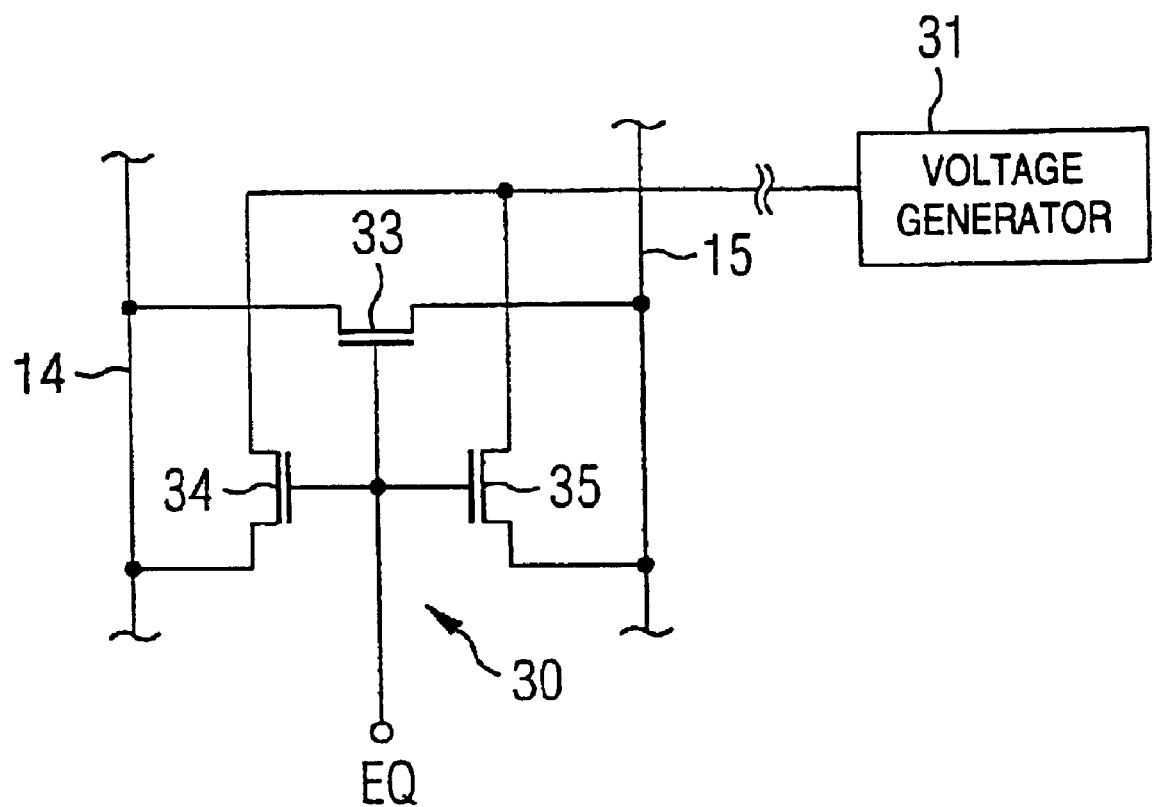

METHOD FOR OPERATING A SEMICONDUCTOR MEMORY AND SEMICONDUCTOR MEMORY

BACKGROUND OF THE INVENTION

Field of the Invention

The invention lies in the semiconductor technology field. More specifically, the invention relates to a method of operating a semiconductor memory, in which data values are written to the memory cells of the semiconductor memory. The invention also relates to a semiconductor memory that is suitable for being operated by the method.

Semiconductor memories, in particular semiconductor memories having dynamic memory cells comprising a selection transistor and a storage capacitor, are constructed in a matrix-like manner. They comprise word lines running in one direction and bit lines running transversely with respect thereto. Memory cells are activated by activation of the word lines, and data values are read in and out via the bit lines and sense amplifiers connected thereto. A word line decoder selects at least one of the word lines for activation in dependence on a word line address. A bit line decoder selects the bit line to be read, so that a memory cell arranged at a crossover between word line and bit line can be individually addressed.

For testing the semiconductor memory, data values representing a predetermined test pattern are written to the semiconductor memory. Afterward, the written-in data are read out again and compared with the written-in value by the test system. If a deviation is ascertained, a functional error is present, for example within the memory cell, the word line, the bit line or the corresponding decoders or even at some other location. In order to be able to test all of the memory cells sufficiently thoroughly according to different criteria, it is necessary for the memory cell array to be written to and read from a number of times. Given the multiplicity of memory cells in present-day semiconductor memories, by way of example semiconductor memories with 256 Mbit dynamic memory cells are available nowadays, just the process of writing to and reading from the memory cells takes up a not inconsiderable time. In order to reduce the test time, endeavors are made to carry out the process of writing predetermined data values to the memory cells as quickly as possible.

Semiconductor memories nowadays have a burst mode. This means that after the application of a start address, a number of memory cells prescribed by the burst length is automatically read. In the case of a cell array with n word lines and m addresses for the selection of bit lines, a number of n*m/burst length write accesses are necessary in order to write to the cell array in its entirety. The duration for writing to the semiconductor memory is therefore essentially determined by the memory size n*m.

SUMMARY OF THE INVENTION

It is accordingly an object of the invention to provide a semiconductor memory and a method of operating a semiconductor memory which overcome the above-mentioned disadvantages of the heretofore-known devices and methods of this general type and which allows the memory cells to be written to as quickly as possible. A further object of the invention is to specify a semiconductor memory which is particularly suitable for carrying out the method.

With the foregoing and other objects in view there is provided, in accordance with the invention, a novel method of operating a semiconductor memory, wherein the semiconductor memory comprises:
  a memory cell array having memory cells for selectively storing a first logic value and a second logic value, word lines and bit lines, each of the memory cells being connected to one of the word lines and one of the bit lines;
  a decoder for simultaneously selecting of one or a plurality of the word lines;
  a voltage generator connected to the bit lines, for applying a predetermined voltage level to the bit lines;
  and the method includes the steps of:
  carrying out a potential equalization of in each case two bit lines;
  subsequently bringing the bit lines to a level representing the first logic value or the second logic value; and
  subsequently selecting a multiplicity of the word lines and writing the levels applied to the bit lines to the memory cells connected to the selected word lines.

In other words, he invention proposes a method for operating a semiconductor memory, the semiconductor memory comprising: a memory cell array having memory cells in order to store a first or a second logic value, having word lines and bit lines, each of the memory cells being connected to one of the word lines and one of the bit lines, a decoder for the simultaneous selection of one or a plurality of the word lines, a voltage generator, to which the bit lines are connected in order to apply a predetermined level to the bit lines, and the method comprising the following steps: a potential equalization of in each case two bit lines is carried out, after the conclusion of the potential equalization, the bit lines are brought to a level representing the first or the second logic value, afterward, a multiplicity of the word lines is selected and the levels applied to the bit lines are written to the memory cells connected to the selected word lines.

With the above and other objects in view there is also provided, in accordance with the invention, a semiconductor memory that comprises: a memory cell array having memory cells in order to store a first or a second logic value, having word lines and bit lines, each of the memory cells being connected to one of the word lines and one of the bit lines, a decoder for the simultaneous selection of one or a plurality of the word lines, a voltage generator in order to apply a predetermined level to the bit lines, the voltage generator being designed to generate, on the output side, a level representing the first logic value, a level representing the second logic value, or an equalization level lying between these levels.

The invention is particularly suitable for preallocating a constant logic value, for example "0" or "1", to the entire memory cell array or at least selected portions of the memory cell array. For this purpose, after the application of the equalization level VBLEQ that biases the bit lines, via the same circuit path, either the level representing the logic "0" or the level representing the logic "1" is applied to the bit lines. The word lines are activated, so that the storage capacitor is connected to the respective bit lines. The levels applied to the bit lines are then written to the memory cells. All the word lines connected to the respective word line decoder can be activated, so that, in this way, a logic "0" or alternatively a logic "1" is written to the entire memory cell array including all the memory cells. Since the data values are not written to the memory cells via the conventional read-in path, but rather by additional circuit measures, this operation is designated as physical writing-in of a "0" or "1".

It is also possible for only one portion of the word lines connected to the word line decoder to be activated, so that the respective data values are written only to those memory cells which are connected to this portion of the word lines. In an advantageous manner, "0", for example, may be written to the memory cells which are connected to said first portion of the word lines, while by contrast the opposite data value, for example "1", may be written to the memory cells which are connected to the other, complementary portion of the word lines. In an expedient manner, a logic "0" is written to the memory cells connected to one of the word lines, while a logic "1" is written to the memory cells connected to the directly adjacent word line. This principle is continued such that a logic "0" is again written to the memory cells of the next word line in turn arranged directly adjacent. In this way, it is possible for the memory cell array to be preallocated the data values "0" and "1" in a stripwise manner. If the strip-type writing-in is considered as described above, then there are situated between the memory cells of two word lines which are preallocated one of the data values the memory-cells of a further word line which are preallocated the complementary data value.

In the case of the conventional read-in path, data values are provided at sense amplifiers which correspondingly modulate the bit lines, so that afterward the memory cells are correspondingly written to. In contrast to this, the invention is not attached to the sense amplifier. The sense amplifier is even switched off in order not to influence the bit line. Rather, the voltage generator previously providing the equalization voltage VBLEQ lying between the level values representing a logic "0" and a logic "1", in particular in the center thereof, is modified. This voltage generator is extended to the effect that it can also supply a logic "0" as well as a logic "1". The level for the logic value "0" is at ground potential VSS. The level for the logic value "1" lies between the positive supply voltage and the equalization level VBLEQ and is designated by VBLH. The relationship VBLH=2*VBLEQ holds true. As a result, all the bit lines of the memory cell array are preallocated either a logic "0" or a logic "1". During this preallocation phase, the signal paths which connect the voltage generator to the bit lines remain switched on. By contrast, the sense amplifiers are switched off.

Each of the sense amplifiers is connected to a noninverted bit line, in whose memory cells the data values are stored in noninverted form. The same sense amplifier is additionally connected to an inverted bit line, in whose memory cells the data values are stored in inverted form. In the case of conventional writing of data, therefore, identical data values cannot be written simultaneously to the memory cells connected to an inverted and a noninverted bit line. By means of the invention, by contrast, in each case identical data values can be written to the entire memory cell array in one step.

The invention is particularly suitable for regularly writing predetermined data values to the memory cell array simply and quickly. Thus, the memory cell array can be preallocated in each case an identical data value or blockwise an identical data value or a strip-like pattern of values "0" and "1" can be written in. This is advantageous particularly during the functional testing of a semiconductor memory. The written-in data values are subsequently read out again and compared with a desired value, namely the written-in data value. If a deviation between read-out value and desired value is ascertained, it can be concluded from this that an error is present at a location in the semiconductor memory which, if appropriate, must still be localized by further modified tests.

The rapid preallocation of the entire memory cell array saves test time. In particular in the case of present-day memory sizes of 256 Mbit memory cells or more, the time saved is considerable compared with conventional reading-in of data values. As a result, the semiconductor memory can be produced more cost-effectively or the test time saved can be used for further test sequences which increase the test coverage and test reliability.

The functional sequences in the semiconductor memory are controlled by a superordinate control device, a so-called state machine. After application of a control command, the control device generates a predetermined sequence of different control signals which control all of the functional units which are required for the execution of the desired function. By way of example, the semiconductor memory is put into a suitable test mode. The control device is then preset such that, upon application of an activation command for one of the memory banks, all the memory cells of the memory bank are automatically preallocated.

Other features which are considered as characteristic for the invention are set forth in the appended claims.

Although the invention is illustrated and described herein as embodied in a method for operating a semiconductor memory and a novel semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic block diagram of a detail from a semiconductor memory having dynamic memory cells; and FIG. 2 is a circuit diagram of a detail of an equalization circuit connected between two complementary bit lines.

DESCRIPTION OF THE PREFERRED EMBODIMENTS

Referring now to the figures of the drawing in detail and first, particularly, to FIG. 1 thereof, there is shown a detail from a semiconductor memory, where only functional elements that are relevant in connection with the invention are illustrated. A memory bank 1 is illustrated. Further comparable memory banks are additionally arranged on the chip of the semiconductor memory. A memory bank can be operated independently apart from the peripheral circuits for feeding data and control signals. Memory banks can process data values in time-parallel fashion. An address decoder assigned to a memory bank can only select word and/or bit lines of this one memory bank.

The memory bank 1 comprises a multiplicity of memory cells arranged in rows and columns, of which the memory cells 10, 11, 12, 13 are illustrated. A memory cell, e.g. the memory cell 10, comprises a selection transistor 101, and also a storage capacitor 102. The charge representing a logic value "0" or "1" is stored in the storage capacitor 102. If the selection transistor 101 is activated, i.e. switched on, via a word line 16, the storage capacitor 102 is connected to a bit line 14, so that the quantity of charge stored in the capacitor 102 is output onto the bit line 14. The rows of the semiconductor memory illustrated are formed by the memory cells connected to a respective word line. Columns are formed by the memory cells connected to a bit line. A row decoder or word line decoder 22 can activate at least one of the word lines 16, 17, 18 in a manner dependent on a word line address ADRX. A bit line decoder 21, or more generally a column decoder, selects one of the bit lines 14, 15 in a manner dependent on a column address ADRY. By way of example, the memory cell 10 is activated by word line 16 and bit line 14 being selected via the decoders 22 and 21, respectively.

The two bit lines 14, 15 are adjacent to one another and are connected to a sense amplifier 20. The bit line 14 is the noninverted bit line, in which the data values are stored in noninverted form in the memory cells 10, 12, and the bit line 15 is the inverted bit line, in which the data values stored in the memory cells 11, 13 are stored in inverted form. In order to read out or write a data value to one of the memory cells 10, . . . 13, firstly the bit lines are short-circuited with one another and brought to an equalization potential VBLEQ, lying in the center of a level VSS representing a logic "0" and of a level VBLH representing a logic "1". The equalization potential VBLEQ is provided by a voltage generator 31. The equalization circuit 30, which is connected between the complementary bit lines 14, 15, is illustrated again in detail in FIG. 2.

All of the functional sequences within the semiconductor memory are controlled by a control device 40. On the input side, command signals are applied to the control device 40, and, on the output side, a multiplicity of control signals are generated and distributed on the semiconductor chip, which signals switch the functional units in an appropriately timed manner.

In particular during the functional testing of a semiconductor memory, it is desirable for the entire memory cell array 1 or substantial contiguous parts thereof to be preallocated an identical data value, e.g. "0" or "1". For this purpose, either the level VSS representing the logic "0" or the level VBLH representing the logic "1" is applied after the potential equalization between complementary bit lines 14, 15 by means of the equalization circuit 30. The voltage generator 31, which provides the equalization level VBLEQ, additionally receives the levels VSS and VBLH. The control signal EQ indicates that the potential equalization is taking place. The control signal CTRLL indicates that now, instead of the equalization level VBLEQ, the level VSS for a logic "0" is to be forwarded to the equalization circuit 30. A logic "0" is now applied to the complementary bit lines 14, 15. The control signal CTRLL is likewise fed to the sense amplifier 20, so that it is deactivated. All of the other, non-illustrated bit line pairs of the memory cell array 1 are driven in parallel in the same way.

The word line decoder 22 is also fed corresponding control signals in order to effect the preallocation of the memory cell array 1. The activation of the control signal CTRLA indicates to the word line decoder 22 that a word line that is otherwise to be individualized via the word line address ADRX is not to be activated, rather that instead of this all of the word lines 16, 17, 18 of the memory-cell array are to be activated. The storage capacitors of the memory cells 10, . . . , 13 are connected to the bit lines 14, 15 on account of the activated word line 16, 17, so that the level VSS output by the voltage generator 31 is written to the storage capacitors of the memory cells in parallel, at the same time.

A control signal CTRLX indicates to the word line decoder 22 that only a selection of word lines is to be activated. By way of example, only every second word line is activated in a first phase of the control signal CTRLX. By way of example, the word line 16 is activated, while the word line 17 remains inactive. In this case, in a first phase, the level value VSS is written only to the memory cells 10, 11. Afterward, in a second phase, the word line 16 is deactivated, and the word line 17 is activated. The voltage generator 31 is now changed over to the effect that the bit line high level VBLH representing a logic "1" is forwarded to the equalization circuit 30 and thus to the complementary bit lines 14, 15. Accordingly, a logic "1" is written to the now activated memory cells 12, 13. What is achieved in this way, in a continuation of this principle for all the other word lines, is that logic "0" and logic "1" are alternately written to the memory cells row by row. The memory cell array can thereupon be tested in a modified manner in order to detect specific error types. In the case of writing to the memory cell array 1 in strip form, those bit lines which acquire an even number in the case of consecutive numbering are expediently activated during the first phase. The odd word lines respectively lying in between are subsequently activated. An odd word line lies between two even word lines or an even word line lies between two odd word lines. The word line decoder is designed in such a way that it can activate the group of even word lines and the group of odd word lines separately from one another.

All of the control signals are generated by the control device 40. By way of example, the control device is fed the command bTMBiDC so that the control signals CTRLH, CTRLL, CTRLA, CTRLX and EQ are generated therefrom in order, as described, to drive the memory cell array 1. In the case of the above-mentioned command bTMBIDC, the driving can be effected in such a way that all the word lines are activated and logic "0" is written to the entire memory cell array, or in such a way that all the word lines are activated and logic "1" is written to each memory cell of the memory cell array. The command bTMBIDC can be activated in test operation and is also designated as test mode.

In order to write the strip-type pattern of logic "0" and logic "1" to the memory cell array, superposition of test modes is suitable. Firstly, the semiconductor memory is brought to the test mode bTMBIDC and the voltage generators apply logic "0" to the bit lines. The even word lines are activated in a further test mode. Afterward, the test mode bTMBIDC is set again and logic "1" or the voltage VBLH is applied to the bit lines. The odd word lines are activated in the subsequently superposed test mode. In a corresponding manner, it is also possible to generate other patterns by superposition of the test mode bTMBIDC and of a further test mode. In the test mode bTMBIDC, logic "0" or "1" is applied to the bit lines. The further test mode acts on the word line decoder, where it can activate word lines in groups, e.g. alternatively all the even or all the odd word lines.

If the respective test mode is set, it is possible, by means of a single activation signal which activates in each case one of the memory banks of the entire semiconductor memory, for the preallocation with data values to proceed automatically within the memory bank. The method according to the invention proceeds significantly more quickly compared with known semiconductor memory operating methods in which the sense amplifiers and consecutive addressing of the memory cells are used in order to write data values to the memory cell array.

The equalization circuit 30 is illustrated in detail in FIG. 2. The drain-source path of an equalization transistor 33 is connected between the bit lines 14, 15. Each of the bit lines 14, 15 is connected via an assigned transistor 34 or 35, respectively, to the voltage generator 31, which, depending on the operating case, provides the equalization voltage VBLEQ or the bit line high potential VBLH or the bit line low potential VSS. The three transistors 33, 34, 35 are jointly driven by the control signal EQ. The control signal EQ remains active as long as the equalization level VBLEQ or the levels VSS, VBLH are to be applied to the bit lines.

We claim:

1. A method of operating a semiconductor memory, which comprises:

providing a semiconductor memory with:

a memory cell, array having memory cells for selectively storing a first logic value and a second logic value, word lines and bit lines, each of the memory cells being connected to one of the word lines and one of the bit lines;

a decoder for simultaneously selecting one or a plurality of the word lines;

a voltage generator connected to the bit lines, for applying a predetermined voltage level to the bit lines;

carrying out a potential equalization of in each case two bit lines;

subsequently bringing the bit lines to a level representing the first logic value, subsequently selecting only a portion of the word lines drivably connected to the word line decoder, subsequently bringing the bit lines to a level representing the second logic value, and subsequently selecting another portion of the word lines drivably connected to the word line decoder; and subsequently selecting a multiplicity of the word lines and writing the levels applied to the bit lines into the memory cells connected to the selected word lines.

2. The method according to claim 1, which comprises, after concluding the potential equalization of the bit lines, selecting all of the word lines drivably connected to the word line decoder.

3. The method according to claim 1, which comprises selecting those word lines between which exactly one further word line is arranged for selecting the first portion of the word lines, and selecting those word lines between which exactly one word line belonging to the first portion is arranged for selecting the second portion of the word lines.

4. The method according to claim 1, which comprises reading the memory cells after storing a value therein, for ascertaining a deviation from a stored value.

5. A method of operating a semiconductor memory, which comprises:

providing a semiconductor memory with:

a memory cell array having memory cells for selectively storing a first logic value and a second logic value, word lines and bit lines, each of the memory cells being connected to one of the word lines and one of the bit lines;

a decoder for simultaneously selecting one or a plurality of the word lines;

a voltage generator connected to the bit lines, for applying a predetermined voltage level to the bit lines;

carrying out a potential equalization of in each case two bit lines;

subsequently bringing all of the bit lines in the memory cell array to one of the first and second levels; and subsequently selecting a multiplicity of the word lines and writing the levels applied to the bit lines into the memory cells connected to the selected word lines.

6. The method according to claim 5, wherein the potential equalization of the bit lines comprises bringing the bit lines to a level between the levels respectively representing the first and second values by connecting an output of the voltage generator to the bit lines, and wherein the output of the voltage generator subsequently provides one of the levels.

7. A semiconductor memory, comprising:

a plurality of word lines and bit lines;

a memory cell array having memory cells configured to selectively store a first logic value and a second logic value, each of the memory cells being connected to one of said word lines and one of said bit lines;

a decoder for simultaneously selecting one or a plurality of said word lines; and a voltage generator connectible to said bit lines for applying a predetermined level to said bit lines, said voltage generator being configured to generate and output a first level representing the first logic value, a second level representing the second logic value, and an equalization level lying between the first and second levels, and said voltage generator being controllable to selectively apply one of the first and second levels to the bit lines directly after applying the equalization level to the bit lines.

8. A semiconductor memory, comprising:

a plurality of word lines and bit lines;

a memory cell array having memory cells configured to selectively store a first logic value and a second logic value, each of the memory cells being connected to one of said word lines and one of said bit lines;

a decoder for simultaneously selecting one or a plurality of said word lines;

a voltage generator connectible to said bit lines for applying a predetermined level to said bit lines, said voltage generator being configured to generate and output a first level representing the first logic value, a second level representing the second logic value, and an equalization level lying between the first and second levels; and a control device configured to carry out a potential equalization of in each case two of said bit linen, to subsequently bring said bit lines to a level representing the first logic value, to subsequently select only a portion of said word lines that are drivably connected to said decoder, to subsequently bring said bit lines to a level representing the second logic value, and to subsequently select another portion of said word lines drivably connected to said decoder, and to subsequently select a multiplicity of said word lines and to write the levels applied to said bit lines into said memory cells connected to the selected said word lines.

9. A method of operating a semiconductor memory, which comprises:

providing a semiconductor memory with:

a memory cell array having memory cells for selectively storing a first logic value and a second logic value, word lines and bit lines, each of the memory cells being connected to one of the word lines and one of the bit lines, and a first type of bit lines having memory cells connected thereto for storing data values in non-inverted form and a second type of bit lines having memory cells connected thereto for storing data values in inverted form;

read amplifiers respectively connected to one of the bit lines of the first type and to one of the bit lines of the second type;

a decoder for simultaneously selecting one or a plurality of the word lines;

a voltage generator connected to the bit lines, for applying a predetermined voltage level to the bit lines;

carrying out a potential equalization of in each case two bit lines;

subsequently bringing all of the bit lines to a common level representing the first logic value or the second logic value; and subsequently selecting a multiplicity of the word lines and writing the levels applied to the bit lines to the memory cells connected to the selected word lines, while the read amplifiers are turned off.

10. The method according to claim 9, which comprises, after concluding the potential equalization of the bit lines, selecting all of the word lines that can be driven by the word line decoder.

11. The method according to claim 9, which comprises, after concluding the potential equalization of the bit lines, bringing the bit lines to a level representing the first logic value, subsequently selecting only a portion of the word lines that can be driven by the word line decoder, subsequently bringing the bit lines to a level representing the second logic value, and subsequently selecting another portion of the word lines that can be driven by the word line decoder.

12. The method according to claim 11, which comprises selecting those word lines between which exactly one further word line is arranged for selecting the first portion of the word lines, and selecting those word lines between which exactly one word line belonging to the first portion is arranged for selecting the second portion of the word lines.

13. The method according to claim 9, wherein the potential equalization of the bit lines comprises bringing the bit lines to a level between the levels respectively representing the first and second values by connecting an output of the voltage generator to the bit lines, and wherein the output of the voltage generator subsequently provides one of the levels.

14. The method according to claim 9, which comprises reading the memory cells after storing a value therein, for ascertaining a deviation from a stored value.

15. A semiconductor memory, comprising:

a plurality of word lines and bit lines;

a memory cell array having memory cells configured to selectively store a first logic value and a second logic value, each of the memory cells being connected to one of said word lines and one of said bit lines, said bit lines including a bit lines of a first type connected to memory cells storing data values in non-inverted form and bit lines of a second type connected to memory cells storing data values in inverted form;

read amplifiers respectively connected to one of said bit lines of the first type and one of said bit lines of the second type;

a decoder for simultaneously selecting one or a plurality of said word lines;

a voltage generator connectible to said bit lines for applying a predetermined level to said bit lines, said voltage generator being configured to generate and output a first level representing the first logic value, a second level representing the second logic value, and an equalization level lying between the first and second levels; and a control device configured to:
carry out a potential equalization of in each case two of said bit lines;
after the potential equalization, bring said bit lines to a level representing the first logic value or a level representing the second logic value, and to thereby bring all of the said bit lines to a common level,
subsequently select a multiplicity of said word lines and write the levels applied to said bit lines into said memory cells connected to the selected said word lines while said read amplifier is turned off.

16. The semiconductor memory according to claim 15, wherein said voltage generator is controllable to selectively apply one of the first and second levels to the bit lines directly after applying the equalization level to the bit lines.

* * * * *